Oct. 4, 1966 M. P. SCHREINER 3,277,310

ISOLATED BASE FOUR-LAYER SEMICONDUCTOR SYSTEM

Filed Nov. 13, 1962

MAX P. SCHREINER

INVENTOR.

BY D. Carl Richards

ATTORNEY

United States Patent Office 3,277,310

Patented Oct. 4, 1966

3,277,310

ISOLATED BASE FOUR-LAYER SEMICONDUCTOR SYSTEM

Max P. Schreiner, Richardson, Tex., assignor to Texas Instruments Incorporated, Dallas, Tex., a corporation of Delaware Filed Nov. 13, 1962, Ser. No. 236,844
7 Claims. (Cl. 307—88.5)

This invention relates to a four-terminal semiconductor system in which two base regions are isolated one from the other.

Four-layer semiconductor devices are known to have many desirable characteristics such as in silicon-controlled rectifiers where the initiation of flow of relatively high amplitude currents may readily be controlled by low power much the same as in prior art devices such as thyratrons. However, like thyratrons, silicon-controlled rectifiers will remain in a conducting state until special circuit conditions are established to permit the termination of the current flow. In a four-layer semiconductor device of this character, the only method of turning the current off is to reduce the main current flowing between anode and cathode below a minimum or holding current level. Because of this limitation, four-layer devices have been developed for switching operations. The present invention pertains to such devices.

A PNPN four-layer device may be considered to be equivalent to a PNP and an NPN transistor with a common collector junction. The PNP section of the device is characterized by a current gain which defines the fraction of hole current injected at the emitter thereof which reaches the collector. In the NPN structure there is a current gain which defines the fraction of electron current injected at its emitter which reaches its collector. By combining the two structures as to have a common collector junction, the current gain in a PNPN structure can be pictured as the sum of the current flowing in the individual transistor sections. If the sum of the current gains is equal to or greater than 1.0 for the structure, then the current flow will be limited only by the external circuit, there being produced within the device a regenerative action which results in the current increasing rapidly until the total current through the device is sufficient to maintain the sum of the current gains equal to or greater than 1.0.

The present invention is directed to a device in which the current flow, once it has been initiated, may be terminated at relatively low power. This is accomplished in the present invention by reducing the sum of the current gains to less than 1.0 through the use of a particular semiconductor structure.

More particularly, in accordance with the present invention, there is provided a four-layer semiconductor device having an anode and cathode and which is provided with two control base regions isolated one from the other so as to bring about voltage breakdown from one base input to the other base input upon application of suitable voltages thereto. The contribution of current gain taking place in the individual zones of the device is thus modified.

In a more specific aspect of the invention, there is provided a semiconductor wafer of a first conductivity type having layers of opposite conductivity type on each of the top surface and the bottom surface thereof. An emitter zone of the first conductivity type is provided in the top surface forming a rectifying junction with the layer on the top surface over a fraction of the surface area. The wafer is provided with a channel extending from the top surface to a depth below the top surface layer to divide both the emitter and the top surface layer into two surface zones. Separate ohmic connections are then provided leading to each of the two zones of the top surface layer and of the bottom surface layer. A single ohmic connection, preferably spanning the channel and common to the emitter, is provided for the fourth input terminal to the device.

For a more complete understanding of the present invention and for further objects and advantages thereof, reference may now be had to the following description taken in conjunction with the accompanying drawing in which.

Figure 1:
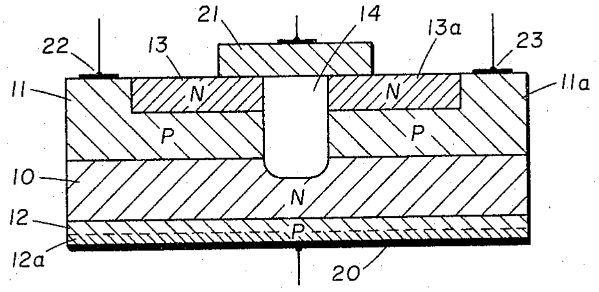
FIGURE 1 is a sectional view of one embodiment of the present invention.
Figure 2:
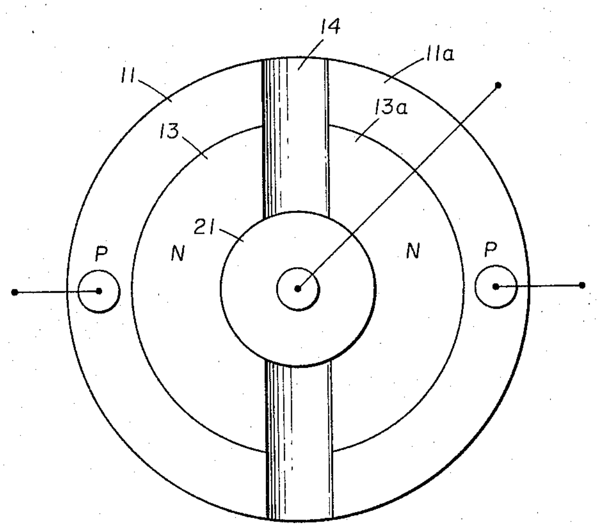
FIGURE 2 is a top view of the device of FIGURE 1.

Referring now to the drawing, there is illustrated in FIGURES 1 and 2 a four-layer semiconductor device. The device is of PNPN configuration. The device is formed from a wafer of semiconductor material of N conductivity type. The wafer is provided with an upper surface layer 11 and a lower surface layer 12, both of P conductivity type material. The layers 11 and 12 may be formed through conventional diffusion techniques. They may be grown epitaxially or may be formed through alloying techniques.

The device is provided with an N conductivity emitter structure 13 on the upper surface of the P conductivity base layer 11. A channel 14 is etched in the upper surface of the wafer. The channel 14 is a depth such that it extends through the P base layer 11 and into the N base layer 10. The channel 14 divides both the emitter 13 and the base layer 11 into two separate zones. The zone 13 is in contact with the zone 11, whereas the zone 13*a* contacts the zone 11*a*. The P emitter layer 12 is provided with a P+ surface layer 12*a* to form an emitter of high emitter efficiency.

The junctions between layers 10 and 12, layers 10 and 11 and layers 11 and 13 are rectifying junctions. Ohmic contacts are then provided for each of four zones. A lower contact 20 is formed on the lower surface of the layer 12*a* to form the anode terminal of the device. Contact 20 of high conductivity is provided to cover nearly all the semiconductor area to prevent current crowding in the semiconductor near the contact region. The cathode terminal is formed by the disk 21 which spans the channel 14 and is in ohmic contact with both of the zones 13 and 13*a*. Ohmic contacts 22 and 23 are provided for each of the zones 11 and 11*a* of the upper layer.

In one embodiment of the invention, the four-layer device was formed by use of ring gate diffusion technique with the etched channel 14 extending through the middle of the device into the N base material of the layer 10. The two N emitters 13 and 13*a* were thus tied together to provide a conventional PNPN characteristic from the anode to the cathode. However, the two base regions 11 and 11*a*, isolated by the channel 14, provide for a voltage breakdown from one gate terminal 22 to the other gate terminal 23 which is equal to the P base-N emitter reverse breakdown voltage. By applying reverse bias on one of the gate-cathode junctions, the current gain of one of the isolated NPN structures will be decreased.

Since the two base zones are isolated in the PNPN structure and since there is a common P emitter and an N base in the PNP structure, a decrease in one of the current gain factors will cause a current crowding and will tend to lower the current gain factor of that region. That is to say, if a bias is applied as between the terminal 22 and the emitter contact 21, anode current will be crowded either into or out of the base zone 10, depending upon the polarity of the bias voltage. With a negative bias this will tend to lower the current gain of the PNP structure due to the distribution of the carriers in the N base region. This limits the maximum contribution of the current gain of the PNP structure that is available at high current. With this structure one of the NPN sections can be used for biasing only and the sum of the current gains in the PNPN structure can be set to a value just above 1.0. With this condition the device can exhibit a high turn-off gain at high anode current without decreasing the high gain of the NPN portion of the control gate. This gives a high turn-on gain together with a high turn-off gain.

While the device illustrated in FIGURES 1 and 2 is symmetrical with respect to the channel 14, it will be understood that it may be asymmetrical and that the asymmetry thereof will in itself serve to alter the current density distribution in the base layers. In this case the bias and control functions applied to the device will be selected in dependence upon the characteristics of the structure itself.

In the embodiment of the invention above described the device formed was a PNPN unit. It will be understood that an NPNP device embodying the essential characteristics of the present invention may also be formed. Reference has been made above to structure formed through diffusion techniques. Devices of the present invention may be formed through use of epitaxial methods, and, in principle, through alloying techniques. In the latter case the problem of control of the relative depths of the alloy and the etch renders this method less desirable than either of the diffusion or epitaxial methods.

Figures 3, 4:
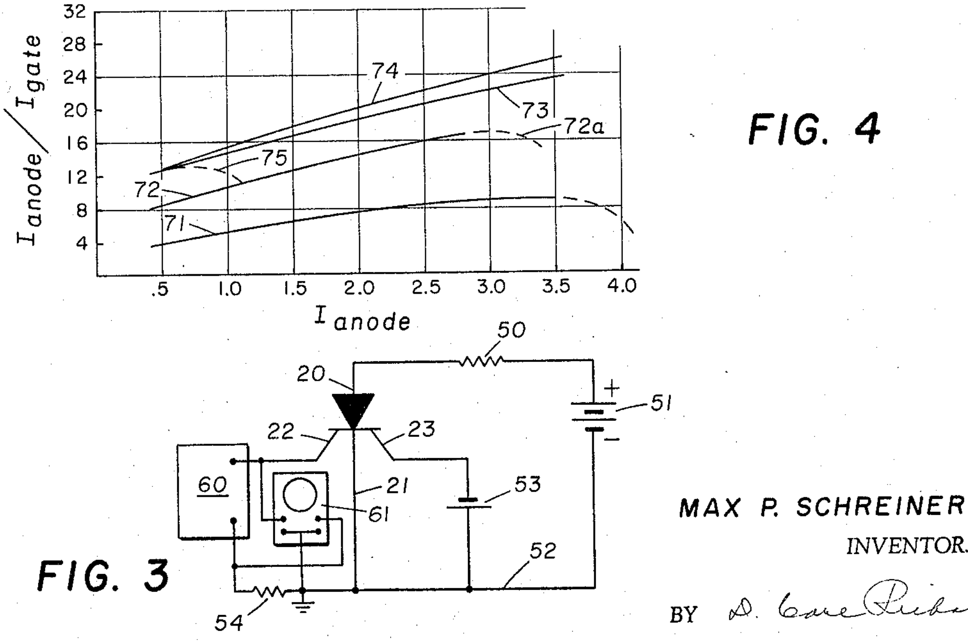
FIGURE 3 illustrates a first circuit arrangement involving the device of FIGURE 1.
FIGURE 4 is a graph illustrating operation of the device shown in FIGURE 3.

In FIGURE 3 one mode of employing this system in a circuit arrangement is illustrated wherein the anode terminal 20 is connected by way of resistor 50 to the positive terminal of a unidirectional current source 51. The negative terminal of source 51 is connected by way of conductor 52 to the cathode terminal 21. A biasing voltage is applied from a bias battery source 53 between terminal 23 and the cathode terminal 21. A control signal from a control source 60 is then applied between the cathode terminal 21 and the second gate terminal 22 by way of resistor 54.

A suitable test instrument, such as the oscilloscope 61, is connected in the circuit to provide an indication of the magnitude of the gate voltage from the source 60 as well as a measure of gate current. More particularly, the common input terminal of the oscilloscope 61 is connected to ground. The left hand or vertical input is connected to the gate terminal 22 and thus provides a measure of the gate voltage. The right hand or horizontal input is connected to the juncture between the pulse source 60 and the resistor 54 and thus provides a measure of gate current involved in any given operation. The relationships between anode current and the ratio of anode current to gate current for one device are illustrated in FIGURE 4.

The bias voltage from source 53 had a magnitude of 1 volt and the source 51 was 50 volts. The resistor 54 was 100 ohms. Plotted as abscissae in FIGURE 4 are values of anode current. Plotted as ordinates are values of turn-off gain or the ratio of anode current to control gate current. There is first plotted a curve 71 which represents the performance of a device having structure the same as that illustrated in FIGURE 1 but without the channel 14, i.e., a more conventional PNPN device. The dotted curve indicates low turn-off gain over much of the operating range with inability of the device to be turned off at high anode currents. Curve 72 illustrates operation of the device of FIGURE 1 without a bias voltage on either of the gates and the gates tied together. The solid portion of the curve 72 indicates that up to relatively high anode currents, the device could be turned off but only at relatively low turn-off gain. However, at high currents the dotted portion 72*a* indicates that the device would not turn off. Curves 73 and 74 indicate that throughout the anode current range tested with the bias voltage on either gate 1 (curve 73) or on gate 2 (curve 74) the device could be turned off at much lower control gate current levels. The operation of the device so far as turn-on gain was concerned was unaltered from that of the device employed for curve 71. However, the device had the distinct advantage that it provides for enhanced ability on termination of the anode current.

Curve 75 illustrates operation with one base terminal floating and with a turn-off pulse applied between the other base and cathode. This illustrates that turn off could be accomplished only at very low current levels.

It will be understood that the terminals 22 and 23 may be of greater area than shown. Furthermore, the disk 21 spanning the channel 14 may take different shapes or may provide different contact zones with the emitter sections 13 and 13*a*. For example, the disk 21 of high conductivity material may be extended in circumference such that it extends almost to the boundary between the sections 13, 13*a* and the base sections 11, 11*a*, respectively.

The conductive layer 20 at the collector contact has been shown as covering the entire lower surface. However, it may be found desirable in some instances to shape the bottom layer for selective control of the current distribution in the collector layer. Generally speaking, it will be desirable to have the lower terminal 20 of substantial area located in a symmetrical relation with respect to a plane passing through the device coincident with the axis of the channel 14.

A gate-controlled switch circuit shown in FIGURE 3 includes the semiconductor device which preferably has a PNPN configuration. The channel extending through the N emitter and the P base region thereof isolates two emitter zones and two base zones one from the other. Separate ohmic connections on each of the P emitter and the two base zones are provided along with a common ohmic connection on the two N emitter zones. The circuit includes a source of current connected in a series circuit which includes a load and the device with connections to the device being completed in the P emitter and at the N emitter zones. A control means is then connected to one of the base zones for initiation and termination of flow of current from the current source through the load and the device. A bias means is then connected to the other of the base zones to modify the normal division of current as between the two N emitter zones upon initiation of current flow between the P emitter and the N emitter zones. The invention contemplates primarily the control of the division of current flowing to the divided surface zone by the application of control potentials. It is to be recognized, however, that a measure of control of distribution can be achieved through provision of an asymmetric terminal on the bottom layer.

Having described the invention in connection with certain specific embodiments thereof, it is to be understood that further modifications may now suggest themselves to those skilled in the art and it is intended to cover such modifications as fall within the scope of the appended claims.

What is claimed is:

1. A gate-controlled switch which comprises:

(a) a semiconductor wafer of a first conductivity type having layers of opposite conductivity type on each of the top surface and the bottom surface thereof forming rectifying junctions, (b) an emitter zone of said first conductivity type in said top surface forming a rectifying junction with the layer on said top surface over a fraction of said top surface, (c) said wafer having a channel extending from said top surface to a depth below the bottom of the top surface layer dividing both said emitter zone and said top surface layer into two surface zones, (d) separate ohmic connections to each of the two zones of said top surface layer and to the bottom surface layer, and (e) an ohmic connection common to both zones of said emitter zone.

2. The combination set forth in claim 1 in which the ohmic connection to said bottom surface layer is of area substantially greater than the area of said channel.

3. A PNPN gate-controlled switch which comprises:

(a) a semiconductor wafer of an N conductivity type having layers of P conductivity type on each of the top surface and the bottom surface thereof, (b) an emitter zone of N-conductivity type in said top surface forming a rectifying junction with the layer on said top surface over a fraction of said top surface, (c) said wafer having a channel extending from said top surface to a depth below the bottom of the top surface layer dividing both said emitter zone and said top surface layer into two surface zones, (d) separate ohmic connections on each of the two zones of said top surface layer and on the bottom surface layer, and (e) an ohmic connection common to both zones of said emitter zone.

4. A gate-controlled switch which comprises:

(a) a semiconductor wafer of a first conductivity type having layers of opposite conductivity type on each of the top surface and the bottom surface thereof, (b) an emitter layer of said first conductivity type on said top surface forming a rectifying junction with the layer on said top surface and having a surface area a fraction of that of said top surface, (c) said wafer having a channel extending from said top surface to a depth below the bottom of the top surface layer thereon dividing both said emitter layer and said top surface layer into two surface zones, (d) separate ohmic connections to each of the two zones of said top surface layer and to the bottom surface layer, and (e) an ohmic connection spanning the channel therein and electrically common to both zones of said emitter layer.

5. A gate-controlled switch circuit which comprises:

(a) a four-layer semiconductor device having a channel extending from one surface through two layers to isolate two first layer zones and two second layer zones one from the other, (b) separate ohmic connections on the fourth layer and on said two second layer zones, (c) a common ohmic connection to said two first layer zones, (d) a source of current connected in a series circuit which includes the fourth layer connection and the first layer connections, (e) means connected to one of said second layer zones to modify the division of current as between said first layer zones which flows from said source between said first layer zones and said fourth layer, and (f) control means connected to the other of said second layer zones for initiating and terminating said current.

6. A gate-controlled switch circuit comprising:

(a) a semiconductor device having a PNPN configuration, said configuration having a P-conductivity emitter and an N-conductivity base, a P-conductivity base and an N-conductivity emitter, respectively, and a channel extending through said N-conductivity emitter and said P-conductivity base, said N emitter being separated into two emitter zones and said P base being separated into two base zones;

(b) an ohmic connection on said P emitter and separate ohmic connections on each of said P base zones;

(c) an ohmic connection leading to both of said two emitter zones;

(d) a current source connected in a series circuit which includes connections to said P emitter and to both of said N emitter zones;

(e) bias means connected between one of said P base zones and said N emitter; and (f) control means connected between the second of said P base zones and both of said N emitter zones, whereby the function of said bias means is to modify the division of current between said two N emitter zones and the function of said control means is to initiate and terminate current flow between said P emitter and said N emitter zones.

7. A gate-controlled switch circuit comprising:

(a) a semiconductor device having a PNPN configuration, said configuration having a P-conductivity emitter and an N-conductivity base, a P-conductivity base and an N-conductivity emitter, respectively, and a channel extending through said N-conductivity emitter and said P-conductivity base, said N emitter being separated into two emitter zones and said P base being separated into two base zones;

(b) an ohmic connection on said P emitter and separate ohmic connections on each of said P base zones;

(c) a common ohmic connection on said two N emitter zones;

(d) a source of current connected in a series circuit including a load and said semiconductor device with ohmic connections to said device being completed at said P emitter and at said common ohmic connection on said two N emitter zones;

(e) means connected to one of said P base zones to initiate and terminate flow of current from said source of current through said load and said semiconductor device; and (f) means connected to the other of said P base zones to modify the normal division of current between said two N emitter zones upon initiation of current flow between said P emitter and said N emitter.

References Cited by the Examiner

UNITED STATES PATENTS

| | | | |
|---|---|---|---|
| 2,735,948 | 2/1956 | Sziklai | 317—234 |
| 2,936,384 | 5/1960 | White | 317—235 |
| 3,090,873 | 5/1963 | Mackintosh | 317—234 |
| 3,201,596 | 8/1965 | Longini | 317—235 |
| 3,210,621 | 10/1965 | Strull | 317—235 |

JOHN W. HUCKERT, *Primary Examiner.*

R. F. POLISSACK, *Assistant Examiner.*